(12) United States Patent
Janik et al.

(10) Patent No.: US 11,262,028 B2
(45) Date of Patent: Mar. 1, 2022

(54) LED LAMP

(71) Applicant: Feit Electric Company, Inc., Pico Rivera, CA (US)

(72) Inventors: Raymond G. Janik, Wheaton, IL (US); Carlo Scianna, Des Plaines, IL (US)

(73) Assignee: Feit Electric Company, Inc., Pico Rivera, CA (US)

( * ) Notice: Subject to any disclaimer, the term of this patent is extended or adjusted under 35 U.S.C. 154(b) by 0 days.

(21) Appl. No.: 17/070,358

(22) Filed: Oct. 14, 2020

(65) Prior Publication Data

US 2021/0048150 A1 Feb. 18, 2021

Related U.S. Application Data

(63) Continuation of application No. 16/802,298, filed on Feb. 26, 2020, now Pat. No. 10,845,009, which is a
(Continued)

(51) Int. Cl.
*F21K 9/232* (2016.01)
*F21K 9/238* (2016.01)
(Continued)

(52) U.S. Cl.
CPC .............. *F21K 9/232* (2016.08); *F21K 9/23* (2016.08); *F21K 9/235* (2016.08); *F21K 9/237* (2016.08);
(Continued)

(58) Field of Classification Search
CPC . F21K 9/232; F21K 9/23; F21K 9/235; F21K 9/237; F21K 9/238; F21V 23/005;
(Continued)

(56) References Cited

U.S. PATENT DOCUMENTS 5,463,280 A  10/1995 Johnson
6,220,722 B1  4/2001 Begemann
(Continued)

FOREIGN PATENT DOCUMENTS

JP  2001-126510 A1  5/2001
JP  2002-525814 A  8/2002
(Continued)

OTHER PUBLICATIONS

U.S. Appl. No. 16/802,298, filed Feb. 26, 2020, U.S. Pat. No. 10,845,009, Patented.
(Continued)

*Primary Examiner* — Evan P Dzierzynski
(74) *Attorney, Agent, or Firm* — Alston & Bird LLP

(57) ABSTRACT

An LED lamp that can take the place of incandescent lamps. An elevated light source is positioned above a screw-type base. A first plurality of LEDs is connected in a series on one side of a flat substrate and a second plurality of LEDs, equal in number to the first, is connected in series on an opposite side of the substrate. Each LED of the first and second plurality of LEDs is mounted proximate a heat sink and a drive circuit is provided for the LEDs, with the drive circuit being located proximate and electrically connected to the screw base.

20 Claims, 16 Drawing Sheets

Figure 1:
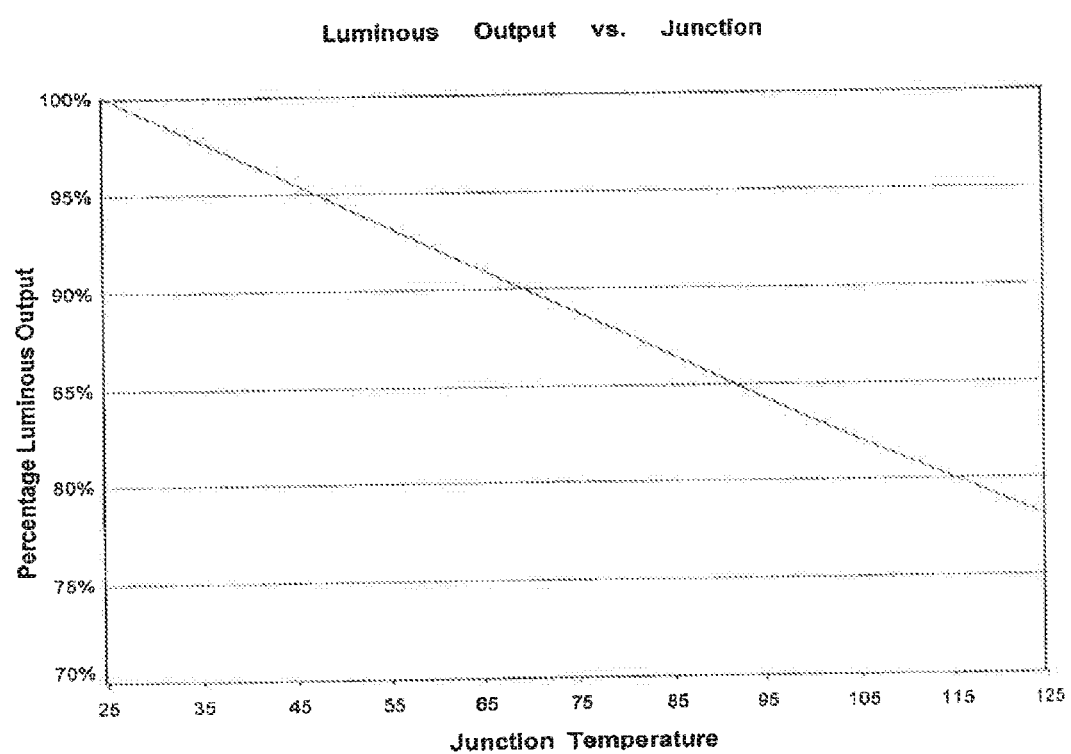

Related U.S. Application Data continuation of application No. 16/381,591, filed on Apr. 11, 2019, now Pat. No. 10,753,547, which is a continuation of application No. 15/370,723, filed on Dec. 6, 2016, now abandoned, which is a continuation of application No. 15/015,834, filed on Feb. 4, 2016, now abandoned, which is a continuation of application No. 14/638,406, filed on Mar. 4, 2015, now Pat. No. 9,267,649, which is a continuation of application No. 13/855,391, filed on Apr. 2, 2013, now Pat. No. 9,016,901, which is a continuation of application No. 12/826,774, filed on Jun. 30, 2010, now Pat. No. 8,408,748, which is a continuation-in-part of application No. PCT/US2009/030741, filed on Jan. 12, 2009.

(60) Provisional application No. 61/020,326, filed on Jan. 10, 2008.

(51) Int. Cl.

| | | |
|---|---|---|
| F21V 3/02 | (2006.01) | |
| H05B 45/10 | (2020.01) | |
| F21K 9/23 | (2016.01) | |
| F21V 23/00 | (2015.01) | |
| F21V 29/70 | (2015.01) | |
| F21V 29/83 | (2015.01) | |
| F21V 19/00 | (2006.01) | |
| F21K 9/235 | (2016.01) | |
| F21K 9/237 | (2016.01) | |
| H05K 1/02 | (2006.01) | |
| F21V 29/80 | (2015.01) | |
| F21Y 115/10 | (2016.01) | |
| F21Y 107/90 | (2016.01) | |
| F21Y 101/00 | (2016.01) | |

(52) U.S. Cl.
CPC .............. *F21K 9/238* (2016.08); *F21V 3/02* (2013.01); *F21V 19/006* (2013.01); *F21V 23/005* (2013.01); *F21V 29/70* (2015.01); *F21V 29/83* (2015.01); *H05B 45/10* (2020.01); *F21V 19/005* (2013.01); *F21V 29/80* (2015.01); *F21Y 2101/00* (2013.01); *F21Y 2107/90* (2016.08); *F21Y 2115/10* (2016.08); *H05K 1/0207* (2013.01)

(58) Field of Classification Search
CPC ........ F21V 19/006; F21V 29/83; F21V 29/70; F21V 3/02; H05B 45/10; F21Y 2101/00; F21Y 2107/90

See application file for complete search history.

(56) References Cited

U.S. PATENT DOCUMENTS

| | | | |
|---|---|---|---|
| 6,523,978 | B1 | 2/2003 | Huang |
| 6,568,834 | B1 | 5/2003 | Scianna |
| 6,870,328 | B2 | 3/2005 | Tanabe et al. |
| 7,049,746 | B2 | 5/2006 | Mano et al. |
| 7,086,767 | B2 | 8/2006 | Sidwell et al. |
| 7,396,142 | B2 | 7/2008 | Laizure, Jr. et al. |
| 7,726,836 | B2 | 6/2010 | Chen |
| 7,938,562 | B2 | 5/2011 | Ivey et al. |
| 7,964,883 | B2 | 6/2011 | Mazzochette et al. |
| 8,408,748 | B2 | 4/2013 | Janik et al. |
| 9,016,901 | B2 | 4/2015 | Janik et al. |
| 9,267,649 | B2 | 2/2016 | Janik et al. |
| 10,753,547 | B2 | 8/2020 | Janik et al. |
| 10,845,009 | B2 | 11/2020 | Janik et al. |
| 2003/0039122 | A1 | 2/2003 | Cao |
| 2003/0117088 | A1 | 6/2003 | Tanabe et al. |
| 2004/0008525 | A1 | 1/2004 | Shibata |
| 2004/0184272 | A1* | 9/2004 | Wright ................ H05K 1/0206 362/373 |
| 2004/0189218 | A1 | 9/2004 | Leong et al. |
| 2005/0189557 | A1 | 9/2005 | Mazzochette et al. |
| 2005/0254264 | A1 | 11/2005 | Sidwell |
| 2006/0001384 | A1 | 1/2006 | Tain |
| 2006/0215422 | A1 | 9/2006 | Laizure, Jr. et al. |
| 2008/0174224 | A1 | 7/2008 | Liao et al. |
| 2010/0277069 | A1 | 11/2010 | Janik et al. |
| 2013/0285547 | A1 | 10/2013 | Janik et al. |
| 2016/0273715 | A1 | 9/2016 | Janik et al. |
| 2019/0264873 | A1 | 8/2019 | Janik et al. |

FOREIGN PATENT DOCUMENTS

| | | |
|---|---|---|
| JP | 2003-059305 A | 2/2003 |
| JP | 2004-134249 A | 4/2004 |
| JP | 2004-207649 A | 7/2004 |
| JP | 2006-244725 A | 9/2006 |
| WO | WO 2005/085703 A1 | 9/2005 |
| WO | WO 2006/104553 A1 | 10/2006 |

OTHER PUBLICATIONS

U.S. Appl. No. 16/381,591, filed Apr. 11, 2019, U.S. Pat. No. 10,753,547, Patented.
U.S. Appl. No. 15/370,723, filed Dec. 6, 2016, 2017-0102112 A1, Abandoned.
U.S. Appl. No. 15/015,834, filed Feb. 4, 2016, 2016-0273715 A1, Abandoned.
U.S. Appl. No. 14/638,406, filed Mar. 4, 2015, U.S. Pat. No. 9,267,649, Patented.
U.S. Appl. No. 13/855,391, filed Apr. 2, 2013, U.S. Pat. No. 9,016,901, Patented.
U.S. Appl. No. 12/826,774, filed Jun. 30, 2010, U.S. Pat. No. 8,408,748, Patented.
PCT/US2009/030741, filed Jan. 12, 2009, WO 2009/089529, Expired.
Canadian Intellectual Property Office, Requisition by the Examiner for Application No. 2,710,542, dated May 6, 2015, 6 pages, Canada.
Cree, Inc., "About Cree, Inc.", Retrieved from <http://www.cree.com/About-Cree> on Jul. 30, 2015, 1 page.
Cree, Inc., "America's Best-Selling LED Bulb Just Got Better", Oct. 28, 2014, Retrieved from <http://www.cree.com/News-and-Events/Cree-News/Press-Releases/2014/October/New-Cree-LED-Bulb> on Jul. 30, 2015, 1 page.
Cree, Inc., "Cree Introduces The Biggest Thing Since the Light Bulb", Mar. 5, 2013, Retrieved from <http://www.cree.com/News-and-Events/Cree-News/Press-Releases/2013/March/Bulbs> on Jul. 30, 2015, 2 pages.
Declaration of Aaron Feit, Aug. 1, 2015, In the United States District Court for the Middle District of North Carolina in *Feit Electric Company, Inc.*, Plaintiff v. *Cree, Inc.*, Defendant, Civil Action No. 1:15-CV-00535, 7 pages, U.S.A.
Declaration of Richard Shealy, Ph.D., Sep. 3, 2015, In the United States District Court for the Middle District of North Carolina in *Feit Electric Company, Inc.*, Plaintiff v. *Cree, Inc.*, Defendant, Civil Action No. 1:15-CV-00535, 63 pages, U.S.A.
Defendant Cree, Inc.'s Opposition to Feit's Motion for Preliminary Injunction Against Cree, Sep. 3, 2015, In the United States District Court for the Middle District of North Carolina in *Feit Electric Company, Inc.*, Plaintiff v. *Cree, Inc.*, Defendant, Civil Action No. 1:15-CV-00535, 49 pages, U.S.A.
European Patent Office, Communication pursuant to Article 94(3) EPC for Application No. 09701197.7, dated Apr. 26, 2016, 5 pages, Netherlands.
European Patent Office, Extended European Search Report for Application No. 09701197.7, dated Apr. 25, 2012, 7 pages, Germany.
Feit's Brief in Support of its Motion for Preliminary Injunction Against Cree, Aug. 3, 2015, In the United States District Court for

(56) References Cited

OTHER PUBLICATIONS the Middle District of North Carolina in *Feit Electric Company, Inc.*, Plaintiff v. *Cree, Inc.*, Defendant, Civil Action No. 1:15-CV-00535, 111 pages, U.S.A.

Feit's Reply in Support of its Motion for Preliminary Injunction Against Cree, Sep. 21, 2015, In the United States District Court for the Middle District of North Carolina in *Feit Electric Company, Inc.*, Plaintiff v. *Cree, Inc.*, Defendant, Civil Action No. 1:15-CV-00535, 46 pages, U.S.A.

Intellectual Property of India, Examination Report for Application No. 4083/CHENP/2010, dated Mar. 31, 2017, 7 pages, India.

International Searching Authority, International Search Report and Written Opinion for International Application No. PCT/US2009/030741, dated Mar. 3, 2009, 6 pages, United States Patent and Trademark Office, USA.

Japan Patent Office, Notice of Reason for Rejection for Application No. 2014-106991, dated Jan. 12, 2016, 10 pages, Japan.

Japan Patent Office, Notice of Reasons for Rejection for Application No. 2014-106991, dated Jan. 30, 2015, 5 pages, Japan.

Korean Intellectual Property Office, Notice of Decision of Rejection for Application No. 10-2010-7015208, dated Jan. 28, 2016, 6 pages, Republic of Korea.

The International Bureau of WIPO, International Preliminary Report on Patentability for International Application No. PCT/US2009/030741, 5 pages, Switzerland.

The Korean Intellectual Property Tribunal Division 8, Written Ruling of Trial (Dismissed), Appeal against the Final Rejection of KR Application No. 10-2010-7015208, Trial No. 2016WON2522, Sep. 19, 2017, 15 pages, Republic of Korea.

United States Patent and Trademark Office, Notice of Allowance for U.S. Appl. No. 12/826,774, dated Nov. 27, 2012, 9 pages, U.S.A.

United States Patent and Trademark Office, Notice of Allowance for U.S. Appl. No. 13/855,391, dated Mar. 20, 2015, 7 pages, U.S.A.

United States Patent and Trademark Office, Notice of Allowance for U.S. Appl. No. 14/638,406, dated Jan. 13, 2016, 10 pages, U.S.A.

United States Patent and Trademark Office, Office Action for U.S. Appl. No. 12/826,774, dated Aug. 30, 2012, 9 pages, U.S.A.

United States Patent and Trademark Office, Office Action for U.S. Appl. No. 13/855,391, dated Mar. 3, 2013, 11 pages, U.S.A.

United States Patent and Trademark Office, Office Action for U.S. Appl. No. 13/855,391, dated Sep. 11, 2014, 8 pages, U.S.A.

United States Patent and Trademark Office, Office Action for U.S. Appl. No. 14/638,406, dated Jun. 18, 2015, 7 pages, U.S.A.

United States Patent and Trademark Office, Office Action for U.S. Appl. No. 15/015,834, dated Sep. 22, 2016, 14 pages, U.S.A.

\* cited by examiner

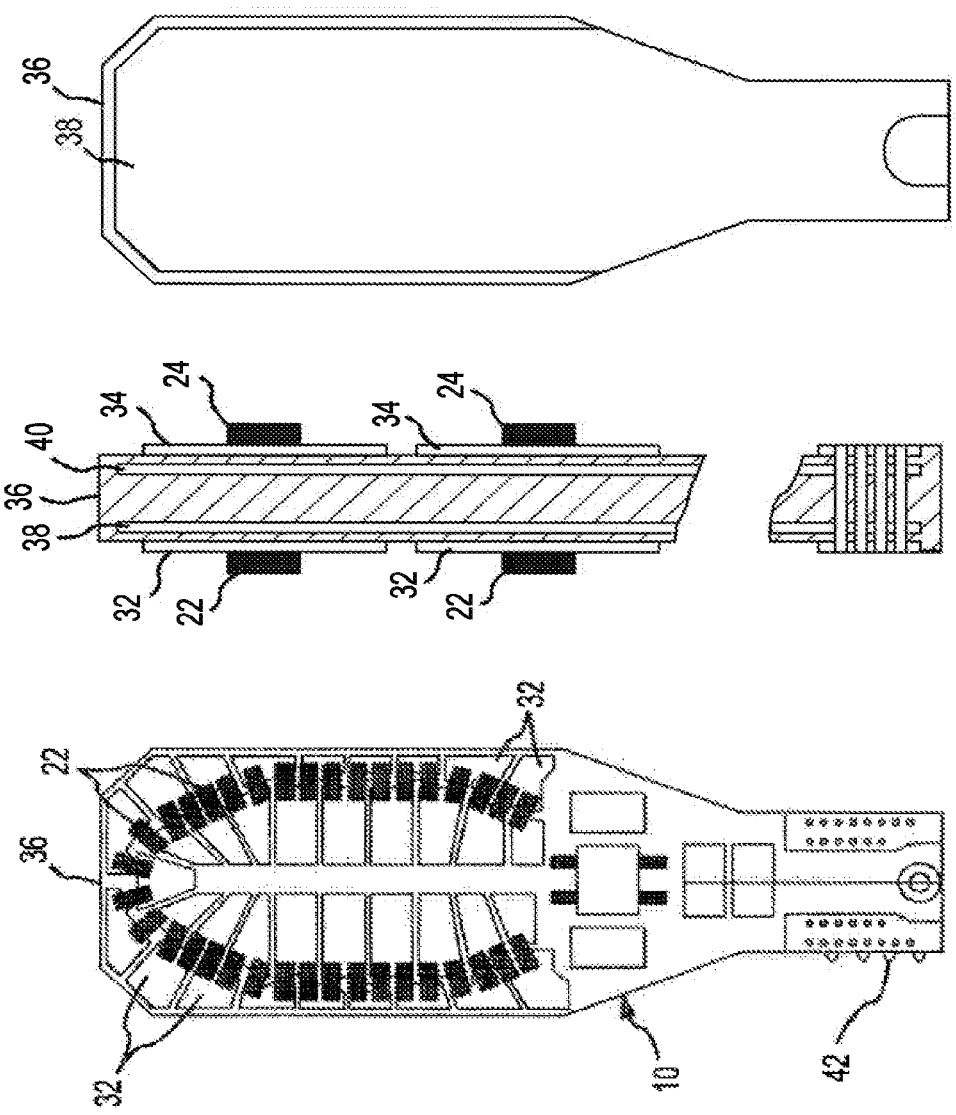

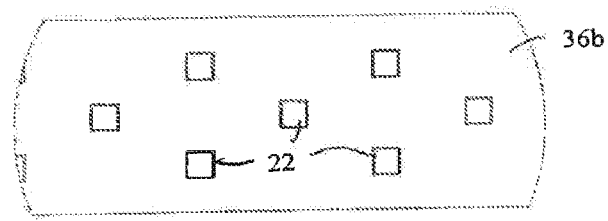
FIG. 14C
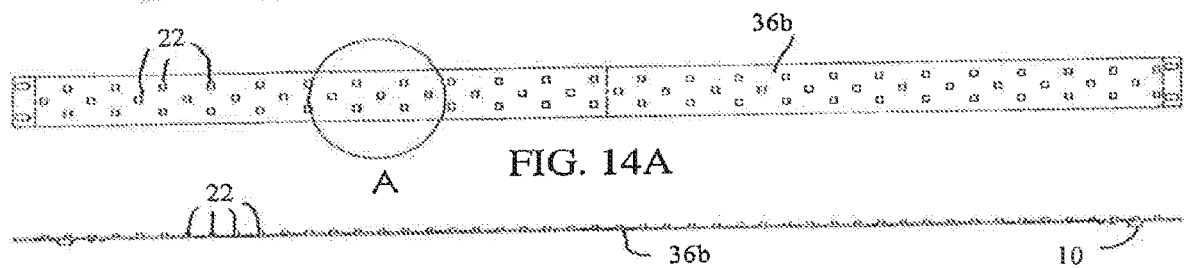
FIG. 14A
FIG. 14B
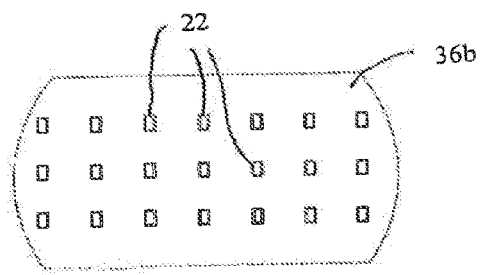
FIG. 14F
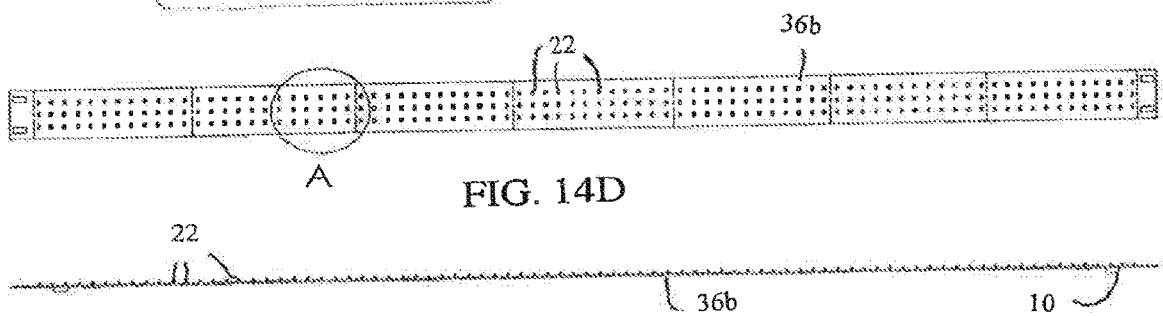
FIG. 14D
FIG. 14E

LED LAMP

CROSS-REFERENCE TO RELATED APPLICATIONS

This application is a continuation of co-pending U.S. application Ser. No. 16/802,298, filed Feb. 26, 2020, which application is a continuation of U.S. application Ser. No. 16/381,591, filed Apr. 11, 2019 (now U.S. Pat. No. 10,753, 547, granted Aug. 25, 2020), which application is a continuation of U.S. application Ser. No. 15/370,723, filed Dec. 6, 2016, which application is a continuation of U.S. application Ser. No. 15/015,834, filed Feb. 4, 2016, which application is a continuation of U.S. patent application Ser. No. 14/638,406, filed Mar. 4, 2015 (now U.S. Pat. No. 9,267, 649, granted Feb. 23, 2016); which application is a continuation of U.S. patent application Ser. No. 13/855,391, filed Apr. 2, 2013 (now U.S. Pat. No. 9,016,901, granted Apr. 28, 2015); which application is a continuation of U.S. patent application Ser. No. 12/826,774, filed Jun. 30, 2010 (now U.S. Pat. No. 8,408,748, granted Apr. 2, 2013); which application is a continuation-in-part of International Application No. PCT/US2009/030741, filed Jan. 12, 2009; which application further claims priority from U.S. Provisional Application No. 61/020,326, filed Jan. 10, 2008; the contents of all of which as are hereby incorporated herein by reference in their entirety.

BACKGROUND

Technical Field

This application relates to LED (light-emitting diode) lamps, and in particular to an LED lamp to replace standard incandescent lamps.

Incandescent lamps have existed for over a hundred years. They are attractive and aesthetically pleasing for their high Color Rendering Index (CRI) and warm color temperature. However, low efficiency, short life and energy waste have been major drawbacks that forced consumers to switch to more efficient sources of light, such as the fluorescent lamp.

The incandescent lamp would have become obsolete many decades ago had it not been for the fact that fluorescent lamps have low CRI, are physically large, exhibit flicker effect and include hazardous materials such as mercury.

Until the late 1980s, LEDs had been primarily used as an indicator light in electronic equipment. Their high efficiency compared to incandescent made them very popular. Towards the late 1990s, high intensity LEDs started emerging, including the white LED. Today, the advancement in LED chip design and manufacturing makes it more feasible than ever to replace the incandescent lamp.

However there remain several challenges that slow the spread of LED lamps:

1. Low maximum LED junction temperature and heat dissipation.

LEDs generate heat at a rate equal to the product of the voltage drop VD and the drive current $I_D$, $$P_{(Watts)} = I_{D(Amp)} \times V_{D(Volt)} = \frac{\Delta Q_{(JOULES)}}{\Delta t_{(Sec)}}$$

where P is the power and Q the heat energy produced by the LED. The LED junction temperature rise is a function of the difference between heat generated and heat dissipated. Heat dissipation is a function of the heat sink surface area, the thermal conductivity of the different media and interfaces and the temperature difference between the heat sink and ambient temperature. Most LEDs have a maximum junction temperature of 125° C. and a few manufacturers advertise up to 180° C. Light output from LEDs is limited by how fast heat can be dissipated away from the die. The luminous output of LEDs is reduced as the junction temperature elevates. FIG. 1 is a plot of the luminous output vs. junction temperature of a typical LED.

2. Luminous Output and Efficacy.

Luminous Efficacy is the ratio of luminous flux (Lm) to applied power (Watts). Typical values of low power incandescent lamp efficacy are:

| Luminous Efficacy | LM/W |
| --- | --- |
| Combustion Candle | 0.3 |
| 5 W Incandescent | 5 |
| 40 W Incandescent | 12 |

LED efficacy has improved over the last few years and has exceeded 100 Lm/W. Commonly available power LEDs can measure up to 85 Lm/W. However, it should be noted that these measurements are taken at 25° C. junction temperature and reduced drive current.

Figure 2:
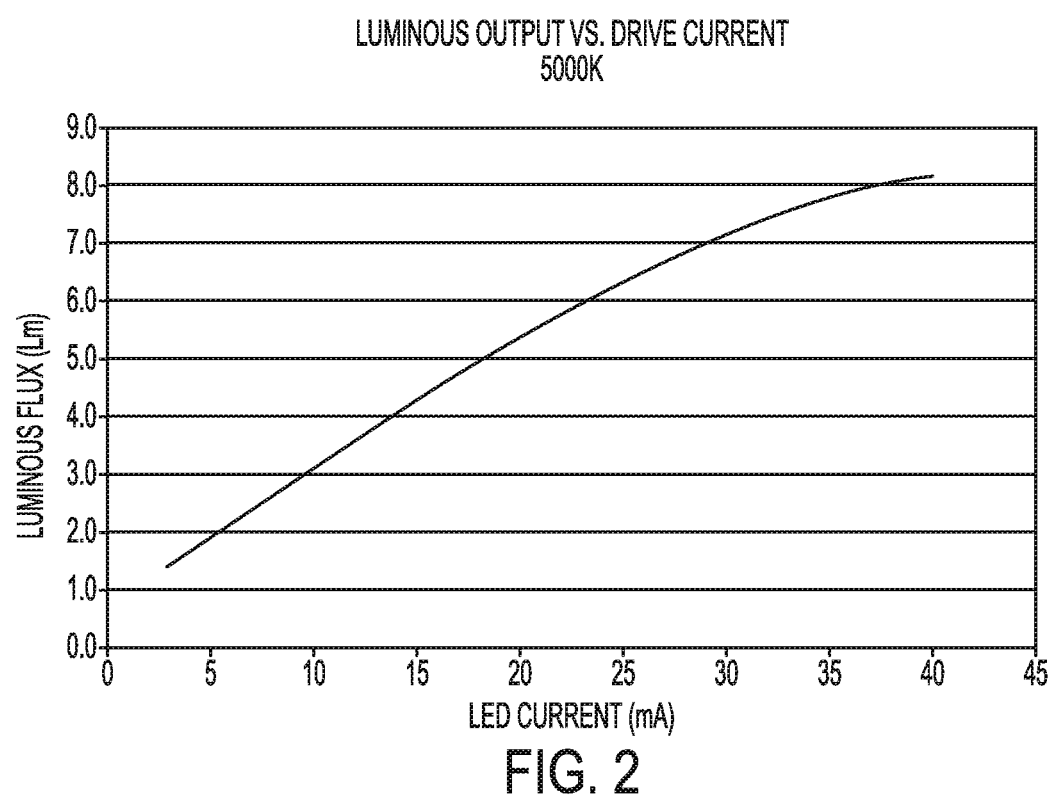
Figure 3:
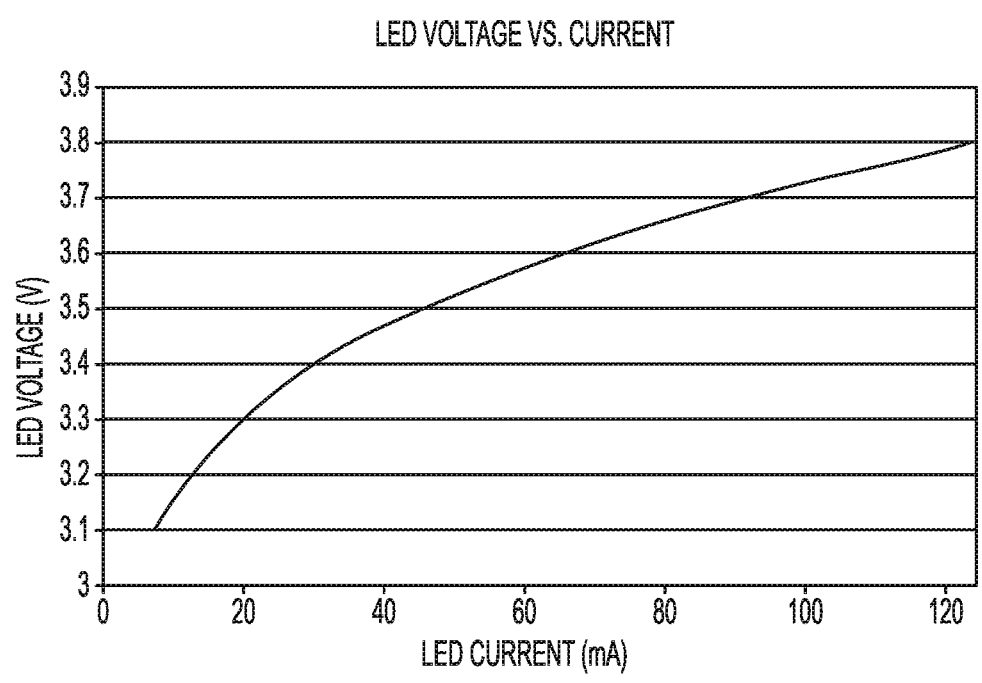

As noted earlier, the luminous output decreases when the die temperature increases. Increasing the drive current has an even greater effect on reducing efficacy. As the current increases, the light output increases in a non-linear fashion, as shown in FIG. 2, but as FIG. 3 shows, the voltage increases as well.

In other words, if the current I is increased by a factor (1+K, where 0<K<1), not only will the luminous output be increased by a factor (k+1, where 0<k<K), but the LED voltage V will also increase by a factor (1+v). The new LED power consumption will become:

$$P=(I+K)\times(V=v)=(I+K)\times V+(I+K)\times v$$

where the first term represents the increase in power due to increase in current only, and the second term represents the increase in power due to increase in current and voltage.

Thus, increasing the LED current will increase the LED output at the expense of reducing its efficacy. The percentage increase in lumens is lower than that of the increase in current, which will reduce efficacy at a much higher rate.

3. An LED is a unidirectional light source.

Figure 4:
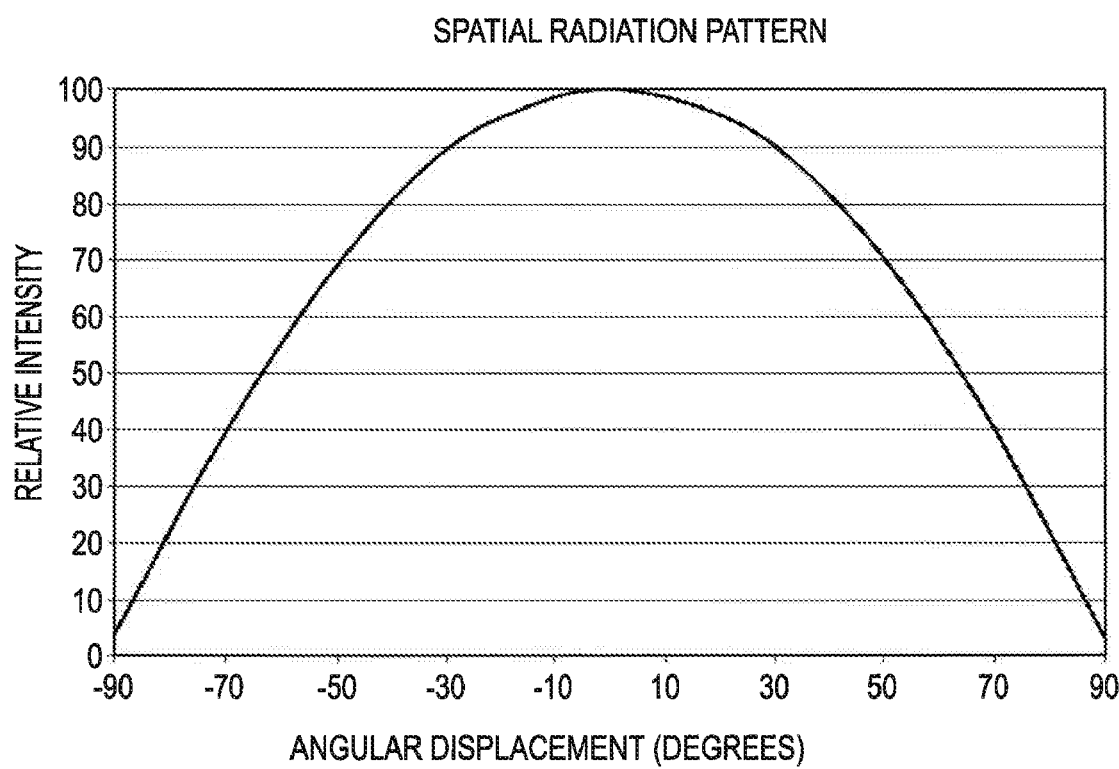

LEDs emit light in a cone that is less than a half space, making it difficult to be used in a traditional "A" type lamp, as FIG. 4 shows. When mounted on a heat sink and placed in a bulb-like shell, some of the light will be absorbed by the package and lens material which will reduce the system efficacy, For a successful implementation of the LED in an 'A' type lamp, the LED needs to be elevated to the center of the bulb, but this reduces the thermal dissipation capabilities.

4. Need for power conversion.

Figure 5:
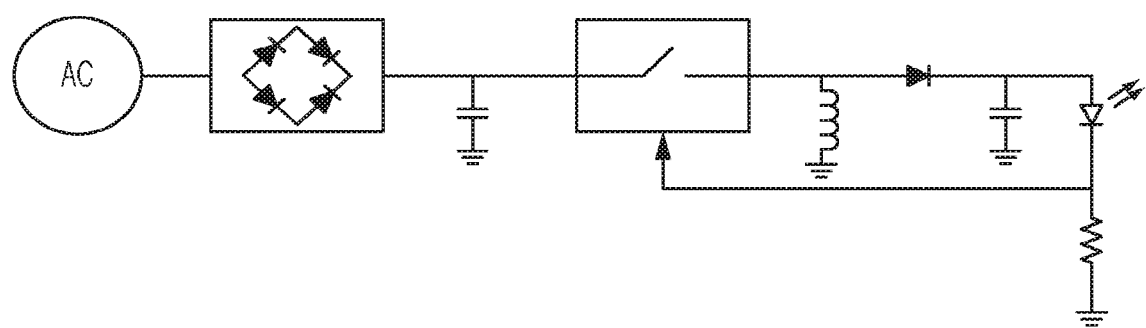

LEDs are current driven devices that require a constant current source power supply (FIG. 5). As FIG. 3 indicates, the voltage reflected by an LED is an exponential function of the drive current. An LED cannot be driven by a voltage source, since the source voltage must match the LED voltage. Otherwise, the difference in voltage divided by the total circuit resistance will result in a current that would easily exceed the maximum LED rating and cause the device to fail.

A constant current source power supply adds cost and reduces the reliability and efficiency of the LED lamp system. A fly-back power supply under 5 watts has a typical efficiency of less than 80% which will reduce the luminous efficacy of the whole lamp system.

Power supplies occupy valuable real estate in a lamp system, and special measures need to be taken in order to isolate a power supply from the heat generated by the LED.

5. Dimmability.

A dimmer controls the light output by phase controlling the AC input voltage. However, a constant current power supply will compensate for any change in input voltage in order to keep the output current constant. There are specialty power supplies that permit dimmability. These power supplies are designed to produce an output current that is proportional to the RMS input voltage. Such power supplies are generally more complex and exhibit lower efficiency.

FIG. 5 is a block diagram of an off-line switch mode power supply. A switch mode power supply is required to convert the 120 Vac line voltage to a low DC current (10 mA-350 mA). Power supplies of 5 Watts output power or less are almost always fly-back type, and have a typical efficiency of less than 80%. They are also prone to failure if they encounter a surge, where a spike of high voltage could damage the MOSFET switch, especially if a surge suppressor, such as an MOV (metal oxide varistor), is not incorporated.

Another common method of driving low voltage LEDs is by using an impedance in series with AC line to limit the current and drop the excess voltage across it. This impedance may be a resistor, a capacitor or an inductor. A resistor is the cheapest and most available, but the energy $E=I^2 \cdot R \cdot \Delta t$ it dissipates is lost and cannot be recovered. The losses increase with the increase in the difference in voltage between the source voltage and the LED voltage, as demonstrated in FIG. 6.

Assume $V_s=166V$, $V=36V$, and $I=20$ mA. Then, $$R = \frac{V_s - V}{I} = \frac{166 - 36}{0.02} = 6.5 \, k\Omega$$

The power dissipation across the resistor is $P_R=I^2 \times R=2.6$ W

The efficiency of the system becomes:

$$\frac{P_{OUT}}{P_{IN}} = \frac{I \times V}{(I \times V) + P_R} = \frac{0.02 \times 36}{(0.02 \times 36) + 2.6} = \frac{0.72}{3.32} = 22\%$$

Obviously this system is not feasible.

Another solution is to replace R by an impedance that does not dissipate energy, such as an inductor or a capacitor. A capacitor is more available in size and value than an inductor. The only limiting factor is the maximum allowable voltage drop across the capacitor. However, this solution renders the LED non-dimmable and increases the size of the circuit board due to the large size of the AC capacitor which needs to be rated to the line voltage plus a margin.

The resistor impedance solution would be feasible if the power dissipation is reduced, which is accomplished if the voltage difference (Vs–V) is reduced. This is done by increasing the number of LEDs in series until the total LED voltage drop approaches the source voltage Vs which will reduce the voltage difference (Vs–V) as well as the value of R required to limit the current.

For example, assume several LEDs are connected in series to produce a total load voltage V=136V. The new value for R is:

$$R = \frac{V_s - V}{I} = \frac{166 - 136}{0.02} = 1.5 \, k\Omega$$

The new power dissipation is $$P_R = I^2_{LOAD} R = 0.6W$$

The new system efficiency becomes $$\frac{P_{OUT}}{P_{IN}} = \frac{I \times V}{(I \times V) + P_R} = \frac{0.02 \times 136}{(0.02 \times 116) + 0.6} = \frac{2.72}{3.32} = 82\%$$

Clearly, this is well within the acceptable range for power supply efficiency, which is accomplished by shifting more of the wasted power to useful power.

BRIEF SUMMARY

The invention is directed to an LED lamp comprising a base and an elevated light source. The light source is composed of a first plurality of LEDs connected in series and mounted on one side of a generally flat substrate, the substrate being spaced from the base, and a second plurality of LEDs, connected in series and mounted on an opposite side of the substrate, with the second plurality of LEDs being located generally in registration with the first plurality of LEDs. A heat sink is in the substrate, with each LED of the first and second plurality of LEDs being mounted proximate the heat sink. A drive circuit is provided for the LEDs, the drive circuit being located proximate and electrically connected to the base.

In accordance with the preferred form of the invention, the base is a screw-type base. The drive circuit is mounted on a circuit board extending from the flat substrate, the circuit board extending into the base.

In one form of the invention, the heat sink comprises at least one conductive heat island on each side of the substrate, each LED of the first plurality of LEDs being proximate a heat island on the one side of the substrate, and each LED of the second plurality of LEDs being proximate a heat island on the opposite side of the substrate. The heat sink also includes at least one conductive heat spreader, each heat island being connected to the heat spreader. The heat spreader is located in the substrate, and extends to the base. Preferably, there are first and second heat spreaders, with each heat island on one side of the substrate being connected to the first heat spreader and each heat island on the opposite side being connected to the second heat spreader. Each heat spreader is preferably a unitary structure, although the heat spreaders can be a series of conductive elements connected to one another.

Preferably, the invention is in the shape of a conventional light bulb. It therefore includes a globe which is connected to the base. The first and second plurality of LEDs are oriented generally in an arc inside the globe.

The drive circuit comprises a surge suppressor, a rectifier, a smoothing capacitor and a resistor, with the first plurality of LEDs and the second plurality of LEDs being connected in parallel and their parallel connection being the resistor.

In one form of the invention, the substrate is oriented parallel to a line extending from the base. In a second form of the invention, the substrate is oriented perpendicular to the line extending from the base. In this form of the invention, the heat sink comprises a plurality of conductive heat spreader rods extending from proximate the base to the substrate.

BRIEF DESCRIPTION OF THE SEVERAL VIEWS OF THE DRAWING(S)

Figure 6:
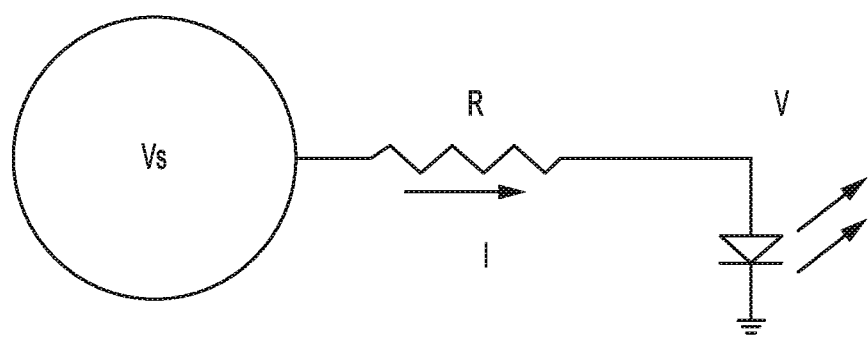
Figure 7:
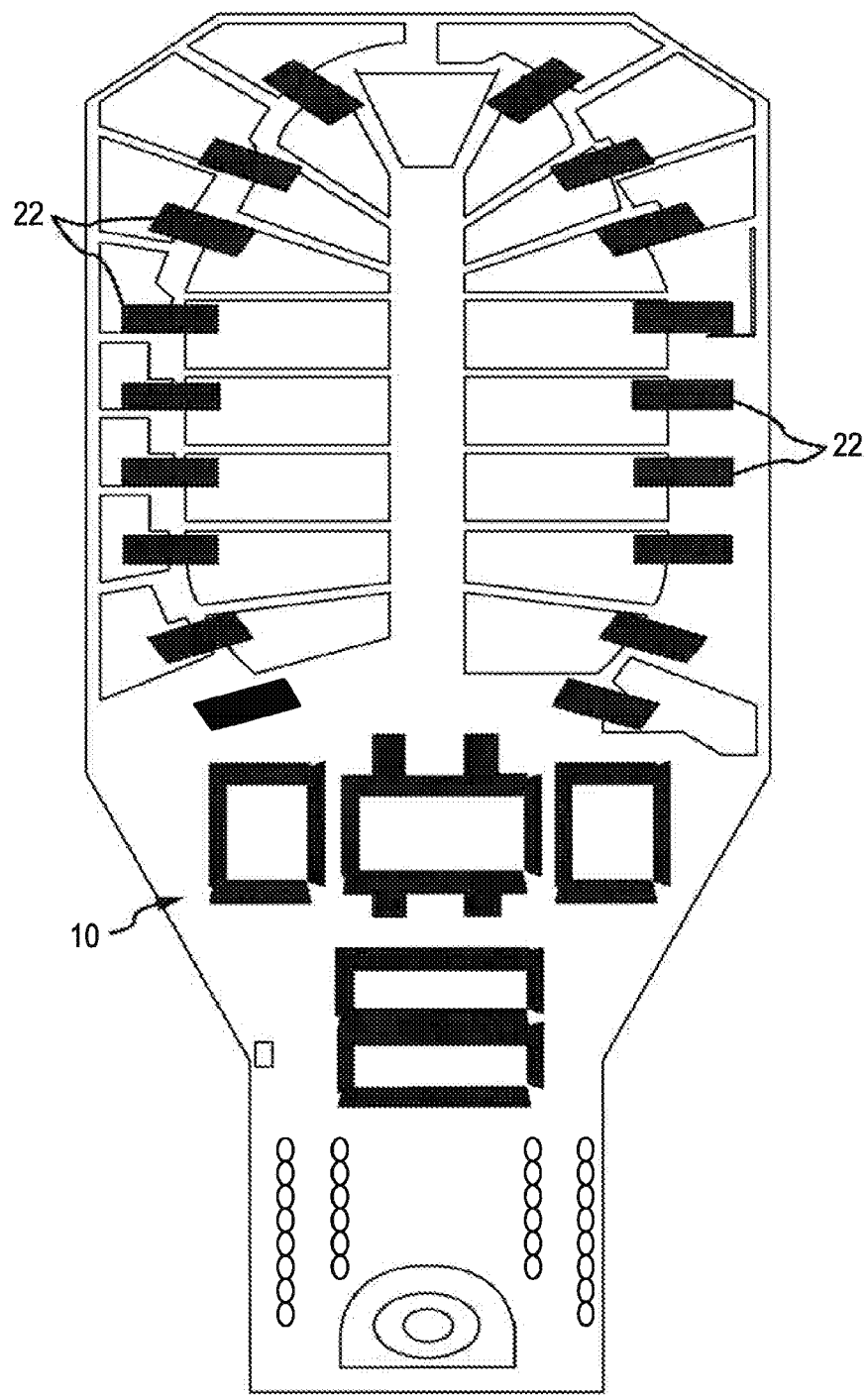
Figure 8:
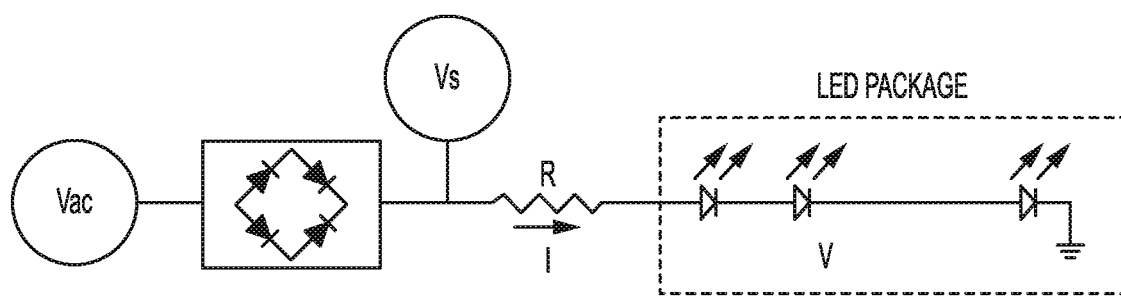
Figure 9:
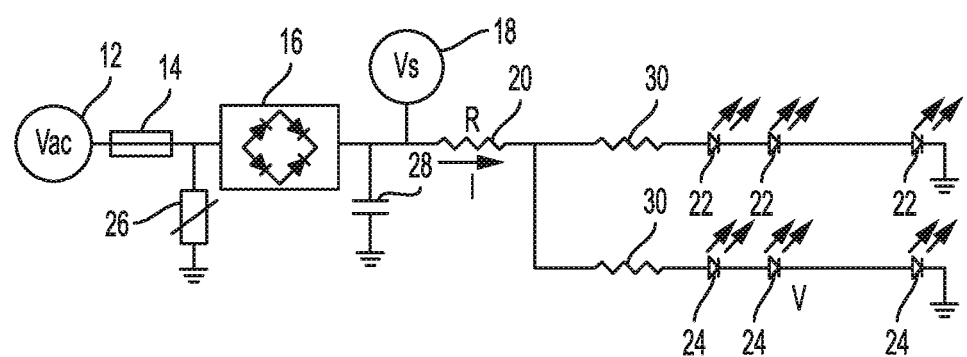
Figure 10:
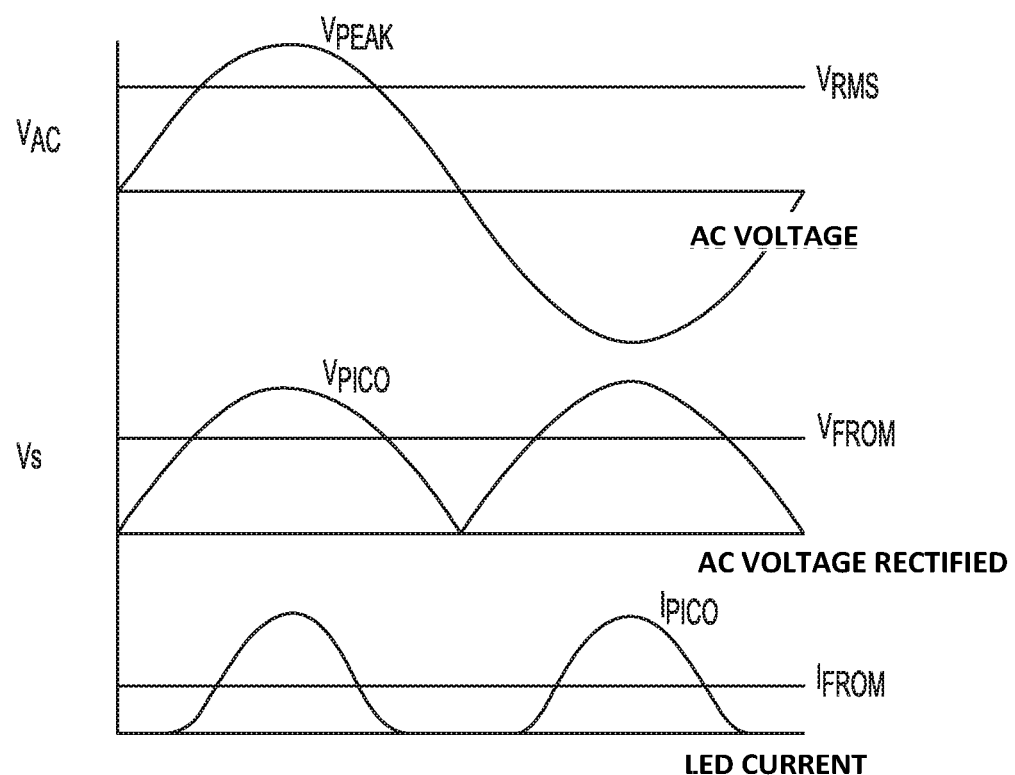
Figure 12C:
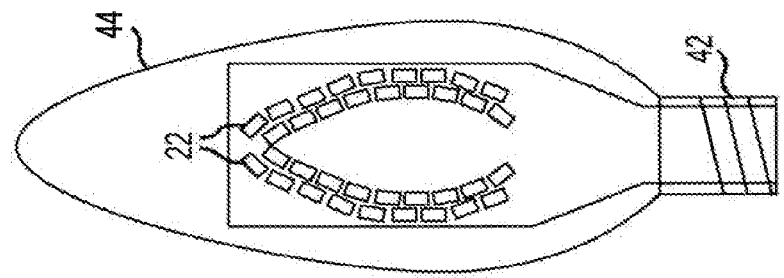
Figure 12B:
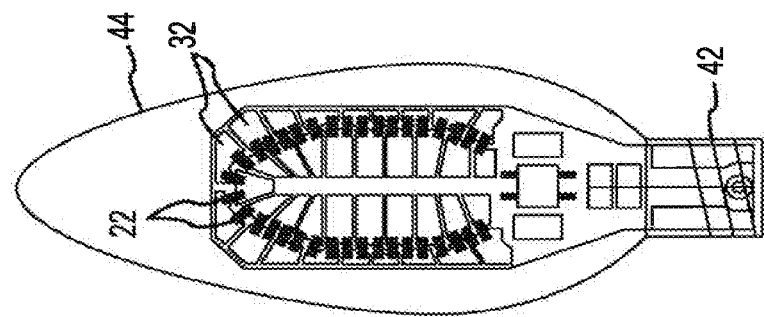
Figure 12A:
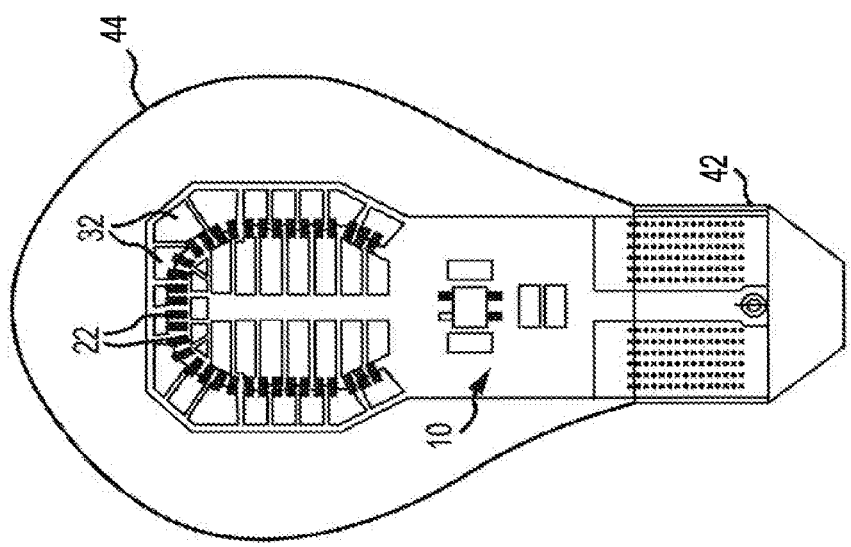
Figures 13A, 13B:
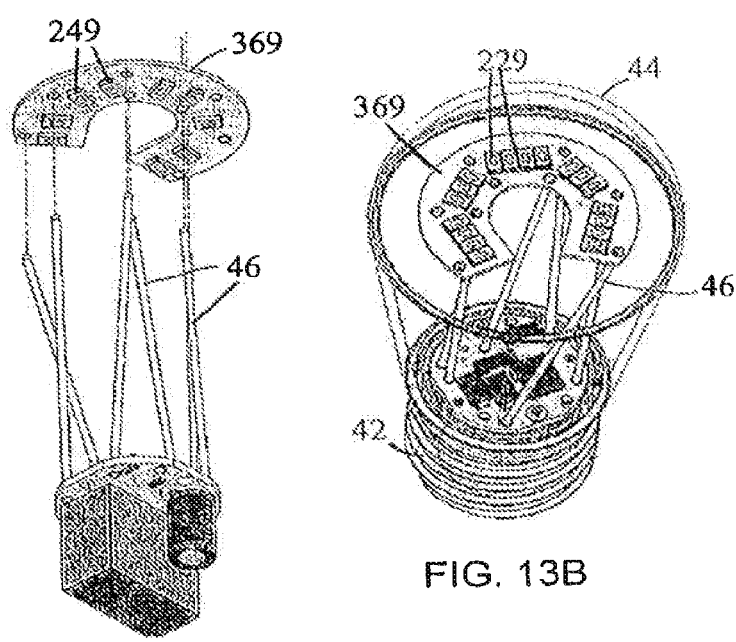
Figure 14:
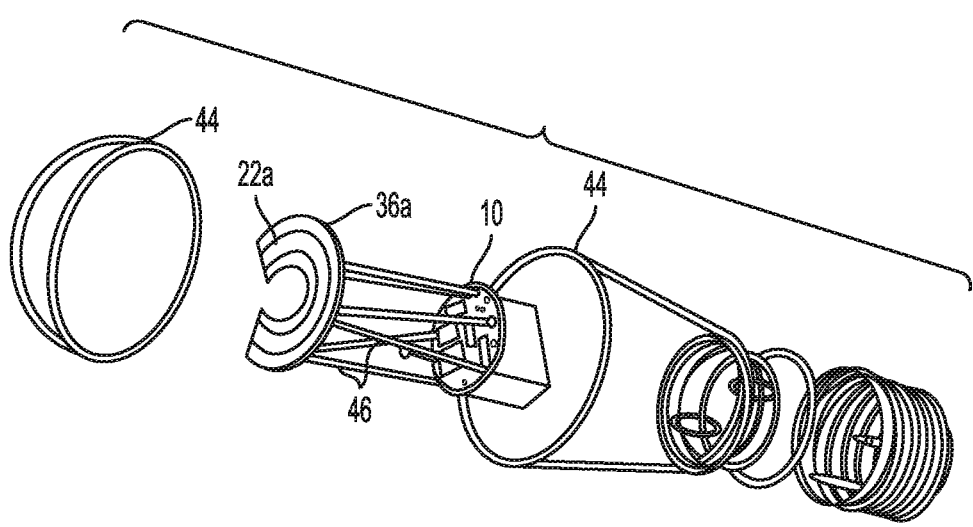
Figure 15C:
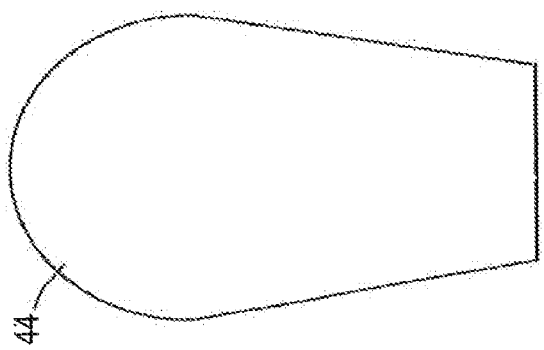
Figure 15B:
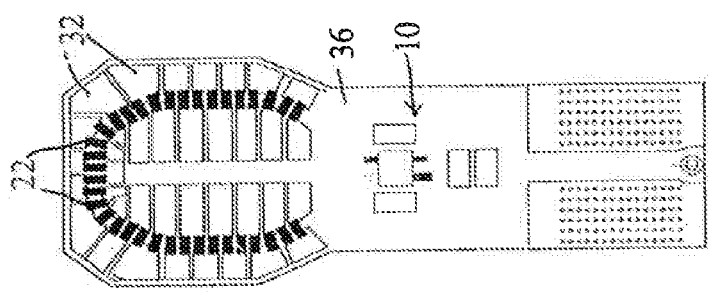
Figure 15A:
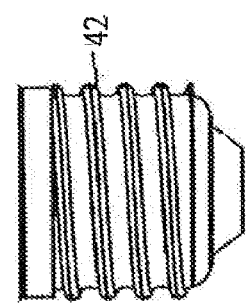

The invention is described in greater detail in the following description of examples embodying the best mode of the invention, taken in conjunction with the drawing figures, in which:

FIG. 1 is a plot of the luminous output versus junction temperature of a typical LED, FIG. 2 is a plot of the light output versus current drive of a LED, FIG. 3 is a plot of LED voltage versus LED current, FIG. 4 is a plot of the cone of light emission of an LED, FIG. 5 is an off-line switch mode power supply for an LED, FIG. 6 demonstrates how losses increase with the increase in the difference between voltage between a source voltage and the LED voltage, FIG. 7 is an elevational illustration of a circuit board according to the invention, FIG. 8 illustrates a simple circuit for connecting LEDs in series, FIG. 9 is a typical circuit used in connection with the present invention, FIG. 10 represents the waveforms for the input alternating current voltage, the rectified voltage and the LED current of the circuit of FIG. 9, FIG. 11A is an elevational view, similar to FIG. 7, of one form of the invention, FIG. 11B is a side elevational illustration of FIG. 11A, FIG. 11C is the substrate of FIGS. 11A and 11B showing the heat spreader, FIG. 12A is an elevational illustration of another form of the invention, FIG. 12B is an elevational view of another form of the invention, FIG. 12C is an elevational view of yet another form of the invention, FIG. 13A is a perspective schematic illustration of another form of the invention with the LEDs oriented perpendicular to the earlier embodiments of the invention, FIG. 13B is a perspective view of the form of the invention shown in FIG. 13A, as a completed lamp, FIG. 14 is an exploded view of the lamp shown in FIG. 13B, FIG. 14A is a plan view of another form of the invention for fluorescent lamp replacement, FIG. 14B is a side elevational view thereof, FIG. 14C is an enlarged partial top plan view of area A of FIG. 14A, FIG. 14D is a second version of the embodiment of FIG. 14A, FIG. 14E is a side elevational view thereof, FIG. 14F is an enlarged partial top plan view of area A of FIG. 14D, and FIGS. 15A-15C illustrate a slightly modified version of the invention shown in FIG. 11, with FIG. 15A showing the base, FIG. 15B showing the circuitry and light source, and FIG. 15C showing the globe.

DETAILED DESCRIPTION OF VARIOUS EMBODIMENTS

The invention produces an LED based lamp that overcomes the above-described limitations of the prior art, namely:

Simple robust power converter
High system luminous efficacy
Dimmable
Efficient 360° light output
Efficient thermal management system
Direct replacement for any low power incandescent lamp
Designed for manufacturability The invention utilizes multiple low cost surface mount LEDs connected in series on a surface board thereby increasing the load voltage drop as well as the useful light output and the system efficiency (FIGS. 7 and 8). This may also be accomplished by assembling LED dies directly on the printed circuit board (Chip On Board) in the same series combination.

An LED emitter can be packaged by combining LED dies in series to produce a high combined LED voltage at the rated current. Such an LED series will draw the same current as a single LED, but will reflect a voltage that is very close to the rectified source voltage. This is different from the Seoul Semiconductor "Acriche" LED where the dies are connected in antiparallel, thereby eliminating the need for a rectifier and transforming the LED into a high voltage AC LED. Combining LEDs in series results in a high voltage DC LED, which will require a rectifier when operated from an AC source. The advantage is the ability to add a smoothing capacitor to reduce current ripple and attain a steady light source with no flicker. The Acriche LED does not allow for a smoothing capacitor to be installed since the rectification process is internal to the package.

The assembly of surface-mount devices (SMD) is an automated and low cost process. It is therefore critical that all components are SMD type. This is another reason a high voltage AC capacitor is not feasible since they are hard to find in SMD.

FIG. 9 is a schematic of a typical circuit according to the invention, designated generally at 10. The invention is described in relation to an alternating current source 12 although obviously if direct current is available, then a rectifier is unnecessary. The alternating current source 12 is supplied through a fuse to a rectifier 16. The rectifier 16 rectifies the alternating current to produce a voltage source, illustrated schematically at 18. A series resistor 20, described above, is followed by two parallel combinations of LEDs 22 in series and LEDs 24 in series. To increase the reliability of the circuit 10, a surface mounted MOV (metal oxide varistor) surge suppressor 26 is also included. A smoothing capacitor 28 reduces current ripple and eliminates flicker.

The efficiency may be further improved by adding more LEDs in series, thus increasing the total voltage drop.

In general, let $\Delta V = V_s - V$ which is the voltage across the resistor 20. For a given load current I, $$R = \frac{\Delta V}{I} \text{ and } P_R = I \times \Delta V.$$

An adverse effect of a low $\Delta V$ is poor regulation. Since the LED voltage drop is not sensitive to current (FIG. 3), a change in the input voltage will be applied to $\Delta V$ only, which will cause the current to change in a proportional manner.

If $\delta V$ is the change in the source voltage $\ddot{V}_s$, the same change will be applied to R, which is now constant. The new current will become:

$$I = \frac{\Delta V + \delta V}{R}$$

where δV may be positive or negative. Let δI represent the change in load current. Then $$\delta I = \frac{\Delta V + \delta V}{R} - \frac{\Delta V}{R} = \frac{\delta V}{R}$$

Regulation will be defined as the percentage change in output:

$$Reg. = \frac{\delta I}{I} = \frac{\frac{\delta V}{R}}{\frac{\Delta V}{R}} = \frac{\delta V}{\Delta V}$$

Regulation is to be made as small as possible in order to minimize the change in output as the input changes. But a low value for regulation means a large value for ΔV, which increases the losses and reduces the efficiency, as described earlier. Recall that:

$$P_R = I \times \Delta V = \frac{(\Delta V)^2}{R},$$

and efficiency:

$$\frac{P_{OUT}}{P_{IN}} = \frac{I \times V}{(I \times V) + P_R}.$$

One aim of the invention is to specify the largest acceptable regulation for a given change δV in source voltage Vs. This will define the smallest ΔV, which will be used to determine R and the efficiency of the system.

FIG. 10 represents the waveforms of the input AC voltage, the rectified voltage, and the LED current.

LEDs are most efficient when driven at a relatively low current where the losses are the lowest. However, this also means that the total lumen is low. For example, if an LED has an efficiency of 100 Lm/W at 0.03 W, then its output will be 3 lumens. An efficient LED does not necessarily mean a bright LED. On the contrary, the most efficient LED may be so dim that it will be rendered unusable as a light source for illumination.

Some prior LEDs have been made up of multiple smaller LEDs, mounted on an insulated aluminum substrate, but they are arranged in series and parallel combination which keeps the total LED voltage low, and its current high. Because the LEDs are packed close to one another, it may be inefficient for all the light to exit, part of which could be absorbed by adjacent LEDs. Driving LEDs at a high current will further reduce efficacy.

In the present invention, the low cost efficient LEDs 22 and 24 are arranged in series, on both layers of a printed circuit board or substrate so as to maximize the total lumen output and reduce absorption. The LEDs are driven at a low current to keep the efficacy high. The low lumen output is compensated by increasing the number of LEDs. Since LED size is miniature and the PCB placement cost of surface mount components is low, the only penalty is LED cost.

Consider two luminous intensities, a 15 Watt/75 Lm, and a 25 Watt/200 Lm incandescent equivalent LED lamp.

For the 75 Lm system, 36 LEDs are arranged in series, 18 on either side of the circuit board in identical locations. The system is shown in FIG. 7 and is driven according to the schematic in FIG. 9, at an LED current of 10 mA. The lumen output per LED at that current is 2 lumens, yielding a total of 75 lumens at a total input power of 1.2 W, and a total system luminous efficacy of 60 Lm/W.

The high output version has two parallel circuits of 36 LEDs each on either sides of the PCB, as shown in FIGS. 11A-11C. The LED current for each series circuit is increased to 30 mA.

Due to the method in which the LEDs are arranged and mounted inside the lamp, more lumens leave the lamp due to less absorption and obstruction.

Even though the large number of LEDs in each circuit will ensure equal current sharing, series resistors 30 are added for each circuit 10 to help dissipate the increase in losses due to the higher output, as well as improve current sharing, The surface mount MOV surge suppressor 26 and fuse 14 can also be added to increase reliability.

Even though the previous discussion was limited to two power levels, the same principle can be applied to achieve a higher power of 40 Watts equivalent or higher. The total system efficacy can be increased by utilizing more LEDs and reducing the drive current.

The brightness of an LED is limited by the maximum junction temperature. In most cases, the junction temperature is 125° C. Assuming a temperature difference of 10° C. between junction and case, a rule of thumb is to maintain a case temperature of no more than 95° C. with a 15° C. margin. The more heat dissipated from the LED junction, the higher the attainable light output.

For prior art power LED lamps of 6 Watts or higher, an external heat sink is usually implemented, which places the LED directly on the heat sink, reducing its affectivity and increasing cost.

The present invention offers an alternate method of LED heat dissipation. Rather than dissipating heat from one power LED through an external heat sink, multiple low power LEDs 24 and 26 dissipate their heat through heat spreader copper islands 32 and 34 on top and bottom layers of a multi-layered PCB board or substrate 36. The islands 32 and 34 transfer the heat to two inner layers of copper heat spreaders 38 and 40. Each is located very close to the heat islands 32 and 34 on the outer layers. The inner spreaders 38 and 40 conduct heat internally to a screw base 42 of the lamp, which in turn will dissipate it away through the fixture and electrical wiring (not illustrated). Since the screw base 42 is connected to AC line, it needs to be fully isolated from the rest of the circuit 10. The core thickness of the substrate 36 between the outer islands 32 and 34 and the inner heat spreaders 38 and 40 should have the minimum thickness that the safety standards will allow to reduce thermal resistance to a minimum and maximize heat transfer.

Since in this invention heat is dissipated through conduction to the screw base, the lamp can be placed inside a sealed globe 44 (FIG. 12A, etc.) with no air circulation. It will also allow for more light to radiate, since the LEDs are elevated and more visible.

At the bottom of the LED substrate 36, the heat spreaders 38 and 40 are thermally bonded together by printed circuit board vias, which are means to provide electrical connection between traces on different layers of a circuit board, in order to maximize power dissipation to the screw base by thermally conducting heat from one layer to another.

The LEDs 22 and 24 are positioned on the substrate 36 in an arrangement of an arc that resembles the filament of an incandescent light bulb, with the intention of maintaining its classic look. The power conversion part of the system is installed on a circuit board portion of the substrate 36 in order to minimize cost and simplify assembly. All the components are surface-mount devices which allows for automation.

The LEDs 22 and 24 are placed in registration on either side of the substrate 36 in preferably exactly the same relative location which gives the impression of transparency. Since no external heat sink is used, the lamp globe 24 can be made entirely of transparent material with the LEDs 22 and 24 elevated to maximum lumen efficacy. To better resemble the incandescent lamp, the LED Correlated Color Temperature (CCT) should be 2800° K, which is close to that of an incandescent lamp, and the Color Rendering Index (CRI) should be typically 95. The effect will be to create an identical application, effect and look of an incandescent light bulb.

The LEDs are precisely placed on either side of the substrate 36 to make the substrate look invisible. The effect is for the observer to see only the trace of light. The shapes and arrangement of the LEDs may vary depending on the effect required.

FIG. 12A depicts an A19 and FIGS. 12B and 12C depict B10 type lamps. This invention allows the use of this arrangement of LEDs in any low power incandescent application, including decorative lamps. The pattern in which the LEDs are arranged is not limited to those shown in FIG. 12, and may extend to any arrangement to produce any desired effect.

FIGS. 13A, 13B and 14 are other embodiments of the invention where the heat collectors are solid rods 46 bonded to the heat islands. In this case, the lamp will retain more resemblance to the classical incandescent lamp. The elements are the same as the first form of the invention, but since the substrate is horizontal, all elements have the identifier "a". The power supply circuit 10 is located in the screw base 42 of the lamp.

The LEDs 22 and 24 may be incorporated in a plastic polymer shaped as a filament. The LEDs 22 and 24 may be arranged to illuminate the polymer which will efficiently conduct light and give the impression of continuous filament glow.

Another embodiment is to mount LED dies directly on the substrate 36 in the same pattern (Chip on Board), and apply phosphor on all the dies at once. This will make the group of LED dies glow as one. It can also reduce the LED cost since they are not packaged individually.

The choice of resistive impedance R makes it possible to use with conventional Triac dimmers in a manner similar to incandescent lamps. The only limitation is the LED current which must be higher than the Triac Holding current, which is usually the case since the low intensity B10 type lamps are usually arranged in groups of 5 or more in chandeliers.

The LEDs 22 can also be arranged in a linear fashion to replace a fluorescent lamp, as shown in FIGS. 14A through 14F. In this form of the invention, the LEDs 22 are on one side of a PCB board or substrate 36*b*, while the circuit 10 is located on the opposite side of the board 36*b*.

Just as in the earlier forms of the invention in relation to replacement of an incandescent lamp, the lamp of FIGS. 14A-14F can be completely enclosed in a tube or fixture (not illustrated), due to the low amount of generated heat that needs to be dissipated. The LED correlated color temperature (COT) can be anywhere between 3,000° K to 5,000° K for replicating and replacing bulbs in current fluorescent light systems.

The invention consists of 3 main parts (FIG. 15), screw base 42, LED circuit 10, and lamp globe 44. The LED-bearing substrate 36 is installed in the screw base 42 by first soldering the middle terminal, then by bonding the plated sides to the barrel of the screw base 42. This will ensure electrical contact as well as provide a thermal passage to conduct the heat generated by LEDs 22 and 24 to the screw base 42 and the electrical wiring (not illustrated) which will act as an extended heat sink.

Various changes can be made to the invention without departing from the spirit thereof or scope of the following claims.

What is claimed:

1. A substrate comprising:
   a first plurality of LEDs mounted on one side of the substrate; and
   a second plurality of LEDs mounted on an opposite side of the substrate,
   wherein:
      the first and second plurality of LEDs collectively define a light source, and
      the first and second plurality of LEDs are oriented generally in corresponding elongate non-circular arcs, such that an angle between each adjacently positioned LED of the first and second plurality of LEDs is an acute angle.

2. The substrate according to claim 1, further comprising a heat sink, the heat sink being located proximate each LED of said first and second plurality of LEDs.

3. The substrate according to claim 2, further comprising a drive circuit electrically connected to a base of an LED lamp, wherein said drive circuit is mounted on a circuit board extending from said flat substrate, said circuit board extending into said base, said substrate being spaced from said base.

4. The substrate according to claim 2, in which said heat sink comprises at least one conductive heat island on each side of said substrate, each LED of said first plurality of LEDs being proximate a heat island on said one side, and each LED of said second plurality of LEDs being proximate a heat island on said opposite side.

5. The substrate according to claim 4, in which said heat sink includes at least one conductive heat spreader, each heat island being connected to said heat spreader.

6. The substrate according to claim 5, in which said heat spreader is located in said substrate, said heat spreader extending to a base, said substrate being spaced from said base.

7. The substrate according to claim 5, including first and second heat spreaders, each heat island on said one side of said substrate being connected to said first heat spreader and each heat island on said opposite side being connected to said second heat spreader.

8. The substrate according to claim 7, wherein said heat spreaders are unitary.

9. The substrate according to claim 2, further comprising a drive circuit for said LEDs, said drive circuit being located proximate and electrically connected to a base of a LED lamp.

10. The substrate according to claim 9, wherein the drive circuit comprises a surge suppressor, a rectifier, a smoothing capacitor and resistor, said first plurality of LEDs and said second plurality of LEDs being connected in parallel to said resistor.

11. The substrate according to claim 1, wherein said substrate is generally flat.

12. The substrate according to claim 9, in which said substrate is generally flat and oriented parallel to a line extending from said base.

13. The substrate according to claim 9, in which said substrate is generally flat and oriented perpendicular to a line extending from said base.

14. The substrate according to claim 13, in which said heat sink comprises a plurality of conductive heat spreader rods extending from proximate said base to said substrate.

15. The substrate according to claim 1, wherein one or more of the first or second plurality of LEDs are connected in series.

16. A light source comprising:
a first set of LEDs mounted on one side of a substrate,
a second set of LEDs mounted on an opposite side of said substrate, said first and second plurality of LEDs being oriented generally in corresponding elongate non-circular arcs, such that an acute angle is formed between each adjacently positioned LED of the first and second plurality of LEDs, and
a set of electrically isolated heat sinks defined in a first portion of said substrate, each LED of said first and second sets of LEDs being mounted proximate at least one electrically isolated heat sink of said set of electrically isolated heat sinks.

17. The light source according to claim 16, wherein said first portion of said substrate comprises at least one conductive heat island on each side of said substrate, each LED of said first set of LEDs being proximate a heat island on said one side, and each LED of said second set of LEDs being proximate a heat island on said opposite side.

18. The light source according to claim 16, wherein the light source is part of an LED lamp and wherein:
said LED lamp further comprises a drive circuit for said LEDs, and
each LED of said first and second sets of LEDs is further mounted proximate a second portion of said substrate so as to provide electrical connection between said drive circuit and each LED.

19. The light source according to claim 16, wherein the light source is part of an LED lamp having a base and wherein:
said base is oriented about a central axis extending there-through; and
said substrate extends along and parallel to said central axis.

20. A substrate comprising:
a heat sink comprising at least one conductive heat island on each side of said substrate;
a first plurality of LEDs mounted on one side of the substrate and positioned in an elongate non-circular arcs, such that an acute angle is formed between each adjacently positioned LED of at least the first plurality of LEDs; and
a second plurality of LEDs mounted on an opposite side of the substrate,
wherein:
the first and second plurality of LEDs collectively define a light source, and
each LED of said first and second plurality of LEDs is mounted proximate said heat sink.

* * * * *